(12) United States Patent
Khan et al.

(10) Patent No.: US 7,348,606 B2
(45) Date of Patent: Mar. 25, 2008

(54) NITRIDE-BASED HETEROSTRUCTURE DEVICES

(75) Inventors: Muhammad Asif Khan, Irmo, SC (US); Remigijus Gaska, Latham, NY (US); Michael Shur, Latham, NY (US); Jinwei Yang, Lexington, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 32 days.

(21) Appl. No.: 10/768,944

(22) Filed: Jan. 30, 2004

(65) Prior Publication Data
US 2004/0183096 A1 Sep. 23, 2004

Related U.S. Application Data

(62) Division of application No. 09/966,563, filed on Sep. 27, 2001, now Pat. No. 6,764,888.

(60) Provisional application No. 60/235,565, filed on Sep. 27, 2000.

(51) Int. Cl.
*H01L 21/00* (2006.01)
(52) U.S. Cl. .............. 257/103; 257/183; 257/E21.126; 257/E29.081
(58) Field of Classification Search ............ 257/190, 257/189, 200, 201, 191, 192, 195, 196, 93, 257/103, 94, 95, 96, 98, 101, 102, 183, E33.008, 257/E29.081
See application file for complete search history.

(56) References Cited

U.S. PATENT DOCUMENTS

| | | | | |
|---|---|---|---|---|
| 4,661,175 A | * | 4/1987 | Kuphal et al. | ................. 438/26 |
| 5,523,589 A | * | 6/1996 | Edmond et al. | ............... 257/77 |
| 5,851,905 A | * | 12/1998 | McIntosh et al. | |
| 5,981,977 A | * | 11/1999 | Furukawa et al. | |
| 6,316,793 B1 | * | 11/2001 | Sheppard et al. | |
| 6,359,292 B1 | * | 3/2002 | Sugawara et al. | .......... 257/103 |
| 6,563,141 B1 | * | 5/2003 | Dawson et al. | ............... 257/98 |

FOREIGN PATENT DOCUMENTS

| JP | 09-27639 | * | 1/1997 |
|---|---|---|---|
| JP | 411243251 | * | 9/1999 |

OTHER PUBLICATIONS

"The Influence of the Strain-Induced Electric Field on the Charge Distribution in GaN-AlN-GaN Structure," A.D. Bykhovski et al., Journal of Applied Physics, vol. 74, No. 11, Dec. 1, 1993, pp. 6734-6739.

(Continued)

*Primary Examiner*—Thomas Dickey
*Assistant Examiner*—Fazli Erdem
(74) *Attorney, Agent, or Firm*—John W. LaBatt; Hoffman, Warnick & D'Alessandro, LLC

(57) ABSTRACT

A method of producing nitride based heterostructure devices by using a quaternary layer comprised of AlInGaN. The quaternary layer may be used in conjunction with a ternary layer in varying thicknesses and compositions that independently adjust polarization charges and band offsets for device structure optimization by using strain compensation profiles. The profiles can be adjusted by altering profiles of molar fractions of In and Al.

9 Claims, 8 Drawing Sheets

OTHER PUBLICATIONS

"Pyroelectricity in Gallium Nitride Thin Films," A.D. Bykhovski et al., Applied Physics Letters, vol. 69, No. 21, Nov. 18, 1996, pp. 3254-3256.

"Pyroelectric and Piezoelectric Properties of GaN-Based Materials," M.S. Shur et al., MRS Internet J. Nitride Semicond. Res. 4S1, G1.6 (1999), pp. 1-12.

"Piezoeffect and Gate Current in AlGaN/GaN High Electron Mobility Transistors," R. Gaska et al., Applied Physics Letters, vol. 71, No. 25, Dec. 22, 1997, pp. 3673-3675.

"Two-Dimensional Electron-Gas Density in AlxGa1-xN/GaN Heterostructure Field-Effect Transistors," N. Maeda et al., Applied Physics Letters, vol. 73, No. 13, Sep. 28, 1998, pp. 1856-1858.

"Piezoelectric Charge Densities in AlGaN/GaN HFETs," P.M. Asbeck et al., Electronic Letters, vol. 33, No. 14, Jul. 3, 1997, 1230-1231.

"Spontaneous Polarization and Piezoelectric Constants of III-V Nitrides," F. Bernardini et al., Physical Review B, vol. 56, No. 16, Oct. 15, 1997, pp. R10024-R10027.

"Piezoelectric Doping and Elastic Strain Relaxation in AlGaN-GaN Heterostructure Field Effect Transistors," A. D. Bykhovski et al., Applied Physics Letters, vol. 73, No. 24, Dec. 14, 1998, pp. 3577-3579.

"Ferroelectric Semiconductors," V. M. Fridkin, Russia (1976), p. 90 (pp. 64-65 in English version).

"Lattice and Energy Band Engineering in AlInGaN/GaN/ Heterostructures," M. A. Khan et al., Applied Physics Letters, vol. 76, No. 9, Feb. 28, 2000, pp. 1161-1163.

"Electron Mobility in Modulation-Doped AlGaN-GaN Heterostructures," R. Gaska et al., Applied Physics Letters, vol. 74, No. 2, Jan. 11, 1999, pp. 287-289.

"High Pinch-off Voltage AlGaN-GaN Heterostructure Field Effect Transistor," M. S. Shur et al., Proceedings of ISDRS-97, Charlottesville, VA, Dec. 1997, pp. 377-380.

"Optoelectronic GaN-Based Field Effect Transistors," M. S. Shur et al., SPIE Vol. 2397, pp. 294-303.

"Current/Voltage Characteristic Collapse in AlGaN/GaN Heterostructure Insulated Gate Field Effect Transistors at High Drain Bias," M. A. Khan et al., Electronic Letters, vol. 30, No. 25, Dec. 8, 1994, pp. 2175-2176

\* cited by examiner

NITRIDE-BASED HETEROSTRUCTURE DEVICES

REFERENCE TO PRIOR APPLICATIONS

The current application is a divisional of U.S. patent application Ser. No. 09/966,563, filed on Sep. 27, 2001 now U.S. Pat No. 6,764,888, which claims the benefit of U.S. provisional application Ser. No. 60/235,565, filed on Sep. 27, 2000.

GOVERNMENT LICENSE RIGHTS

The U.S. Government has a paid-up license in this invention and the right in limited circumstances to require the patent owner to license others on reasonable terms as provided for by the terms of VH0A950200-01 awarded by the U.S. Army SMDC/BMDO.

BACKGROUND OF THE INVENTION

1. Technical Field

The current invention relates generally to the production of nitride based heterostructure devices. In particular, the present invention generally relates to nitride based heterostructures having a quaternary barrier layer that comprises AlInGaN for controlling strain, band offsets and lattice mismatches in the devices.

2. Background Art

The large lattice mismatch between GaN, AlN and InN and the strong piezoelectric and polarization effects in these materials significantly impact the electrical and optical properties of III-N heterojunction devices. Nearly all the reported GaN-based High Electron Mobility Transistors (HEMTs) to date use strained GaN-AlGaN junctions with alloy compositions below 35% and 15-20 nm thick barriers to avoid exceeding the critical thickness for the development of dislocations relieving strain. Such strain produces piezoelectric doping with about $1 \times 10^{13}$ cm$^{-2}$ sheet carriers. Additionally, the strain may be responsible for the long-term instabilities observed in some AlGaN/GaN HEMTs.

Therefore, there exists a need for a method and system of building heterojunction devices so that lattice mismatch, and consequently strain, is controlled. As a result, the heterojunction device can be designed to take advantage of piezoelectric and spontaneous polarization effects and long-term instabilities can be minimized.

SUMMARY OF THE INVENTION

The current invention provides a method and system of independently controlling strain and band offsets by providing nitride based heterostructures having a quaternary layer that comprises AlInGaN (Aluminum Indium Gallium Nitride).

The current invention employs strain engineering to demonstrate the influence of piezoelectric and polarization effects in AlInGaN/GaN heterostructures having different indium content. The obtained results show that the contribution to two-dimensional electron gas from spontaneous polarization is approximately equal to the piezoelectric charge. The piezoelectric doping not only changes the sheet electron density but also strongly affects the transport properties of two-dimensional electron gas. The obtained results show that in AlGaN/GaN heterostructures with 12% aluminum, the piezoelectric effects increase the sheet density-mobility product, $n_s\mu$, at room temperature by a factor of 5.

Under the present invention, a low pressure Metal Organic Chemical Vapor Deposition (MOCVD) can grow, for example, $Al_xIn_yGa_{1-x-y}N$—GaN heterojunctions over sapphire, 6H/4H SiC and other substrates, such as silicon or spinel.

In a first aspect of the present invention, a method of producing nitride based heterostructure devices is provided comprising the steps of providing a substrate; and applying a quaternary layer over the substrate, wherein the quaternary layer comprises In.

In a second aspect of the present invention, a method of producing nitride based heterostructure devices is provided comprising the steps of: providing a substrate; applying a first layer comprising GaN over the substrate; applying a ternary layer over the first layer, wherein the ternary layer comprises a compound selected from the group consisting of AlGaN and InGaN; and applying a quaternary layer over the ternary layer, wherein the quaternary layer comprises AlInGaN.

In a third aspect of the present invention, a nitride based heterostructure device is provided comprising: a substrate; a first layer applied over the substrate; and a quaternary layer applied over the first layer wherein the quaternary layer comprises In.

In all these aspects, the Al and In composition might vary between the layer thickness in order to optimize the starin distribution and the band offsets.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which:

FIG. 4a shows measured (dots and triangles) and calculated (solid line) sheet electron density in an AlInGaN/GaN heterostructure with 12% Al and different incorporations of In.

FIG. 4b shows measured (dots and triangles) and calculated (solid lines) sheet electron density in an AlInGaN—AlGaN/GaN heterostructure with 12% Al and different incorporations of In.

Figure 1A:
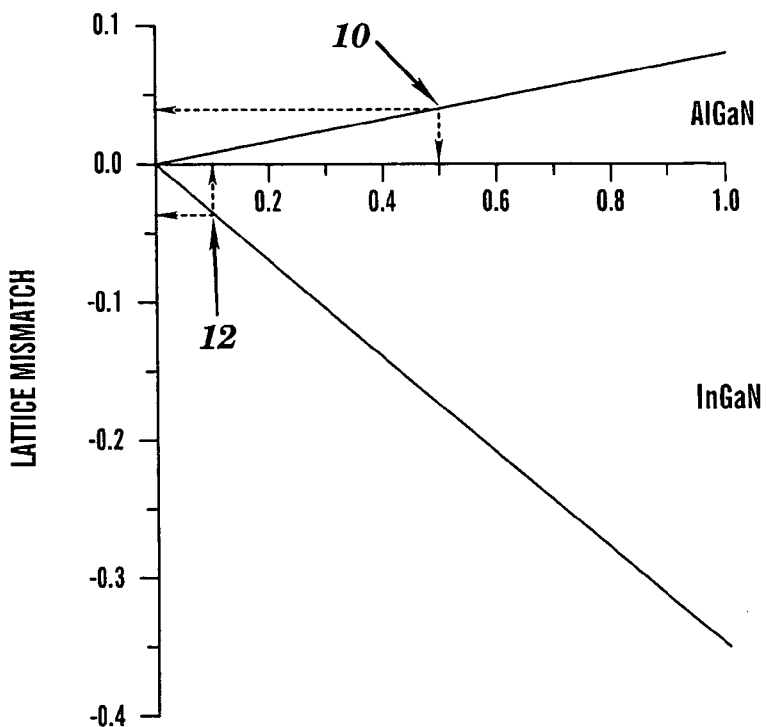
FIGS. 1a and 1b show the schematics of lattice mismatch (FIG. 1a) and band offset (FIG. 1b) in AlGaN and InGaN grown on GaN.

It is noted that the drawings of the invention are not to scale. The drawings are intended to depict only typical embodiments of the invention, and therefore should not be considered as limiting the scope of the invention. In the drawings, like numbering represents like elements between the drawings.

DETAILED DESCRIPTION OF THE DRAWINGS

The present invention relates to nitride based heterostructures having a quaternary layer that comprises AlInGaN (Aluminum Indium Gallium Nitride). The present invention can be used for a variety of heterostructure devices, including (but not limited to) heterostructure field effect transistors, ultraviolet and visible light emitting diodes, ultraviolet and visible photodetectors, dual infrared and ultraviolet light emitters and detectors, pyroelectric and piezoelectric devices, strain and stress sensors, and plasma wave electronics devices. It is understood that for the purposes of the present invention, Al means Aluminum, In means Indium, Ga means Gallium, and N means Nitrogen.

Figure 1B:
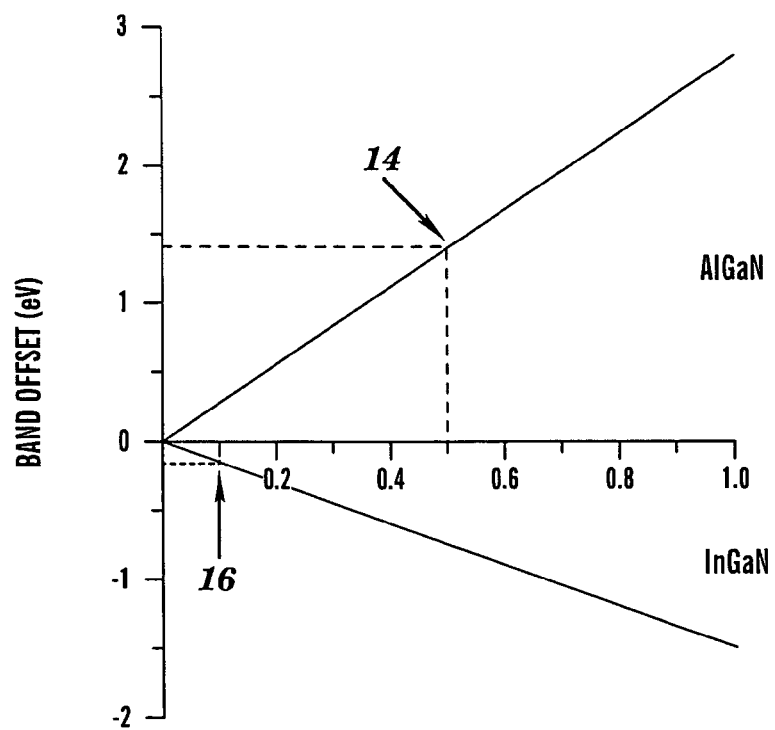

Referring now to FIGS. 1a and 1b, the schematics of lattice mismatch and band offset in AlGaN and InGaN grown on GaN are shown. As shown in FIG. 1a, strain free growth of 50% AlGaN on CaN 10 yields a positive lattice mismatch of roughly 0.003 nm. However, strain free growth of only 10% InGaN on GaN 12 is required to yield a similar negative lattice mismatch. As shown in FIG. 1b, the same 50% AlGaN on GaN 14 has a band offset of about 1.4 eV while the same 10% InGaN on CaN 16 has a band offset of only about 0.2 eV. Based on a linear extrapolation of lattice constants as functions of molar fractions, it is estimated that quaternary $Al_xIn_yGa_{1-x-y}N$ layers with an Al/In mole fraction ratio of 5 should be nearly lattice matched to GaN while the band offset will be about 1.2 eV.

Figure 2:
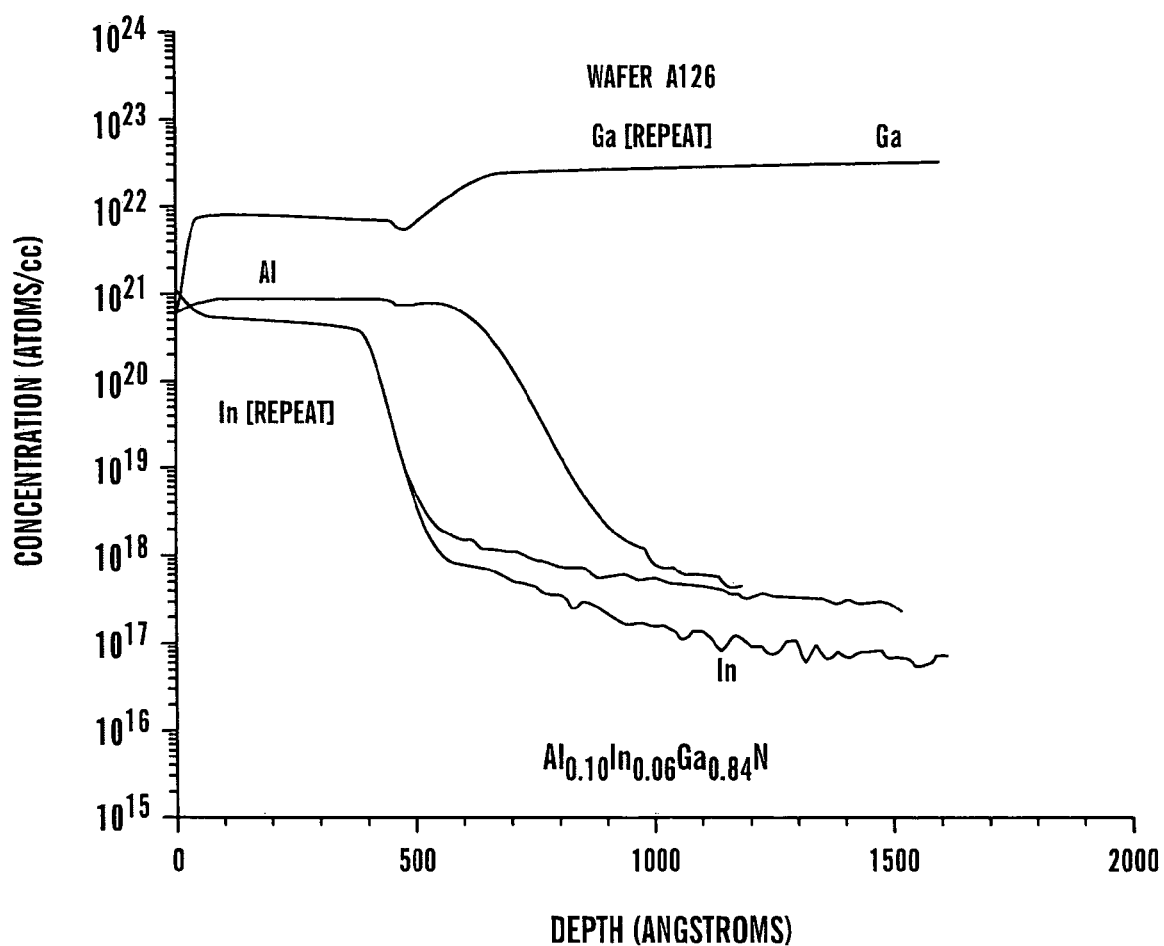
FIG. 2 shows on-axis X-ray of AlInGaN grown on GaN for different In flows (from the top to bottom) of: 0 ccm; 25 ccm; 50 ccm; 75 ccm.

FIG. 2 shows Secondary Ion Mass Spectroscopy (SIMS) measurements used to determine the Al-In-Ga profiles and atomic percentages for one embodiment of the current invention. Several series of $Al_xIn_yGa_{1-x-y}N$—GaN heterojunctions were deposited with different Al-precursor flows. For each series, the Ga-precursor flow was kept constant while varying the In-flow (0, 25, 50 and 75 ccm). The thickness of the GaN and the quaternary $Al_xIn_yGa_{1-x-y}N$ layers were respectively kept at 100 and 200 nm. The data clearly establish the incorporation of indium fractions as large as 6% into AlInGaN quaternary films. Reflection High Electron Difraction (RHEED) measurements also confirmed the single crystal nature of all the $Al_xIn_yGa_{1-x-y}N$ quaternary layers for the growth conditions.

For all of the $Al_xIn_yGa_{1-x-y}N$-GaN heterojunctions, lattice mismatches and bandgaps were measured using X-ray ($\theta$-$2\theta$) diffraction and optical transmission versus wavelength. The bandgap values from transmission were in good agreement with the measured room temperature photoluminescence (PL) peak positions using the $4^{th}$ harmonic of a Q-switched Yttrium Aluminum Garnett (YAG):$Nd^{3+}$ laser radiation (incident photon energy 4.66 eV, pulse duration 10 ns) for optical excitation. The X-ray, SIMS and PL data were then used to estimate the alloy compositions for the quaternary $Al_xIn_yGa_{1-x-y}N$ layers as shown in FIGS. 3a and 3b.

Figure 3B:
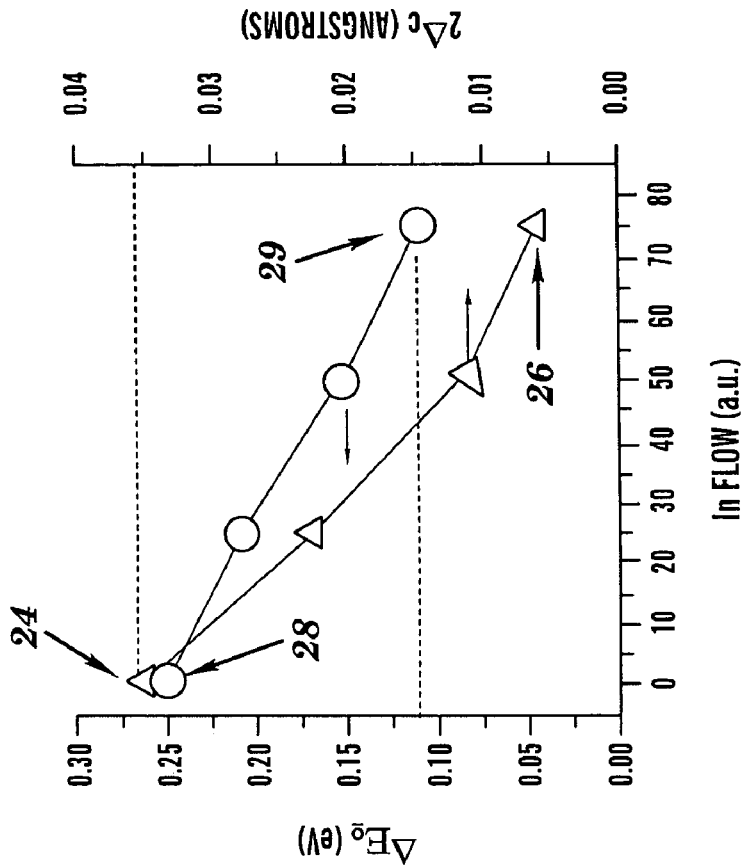
FIG. 3b shows the change in band-gap and lattice constant of AlInGaN as a function of In flow.
Figure 3A:
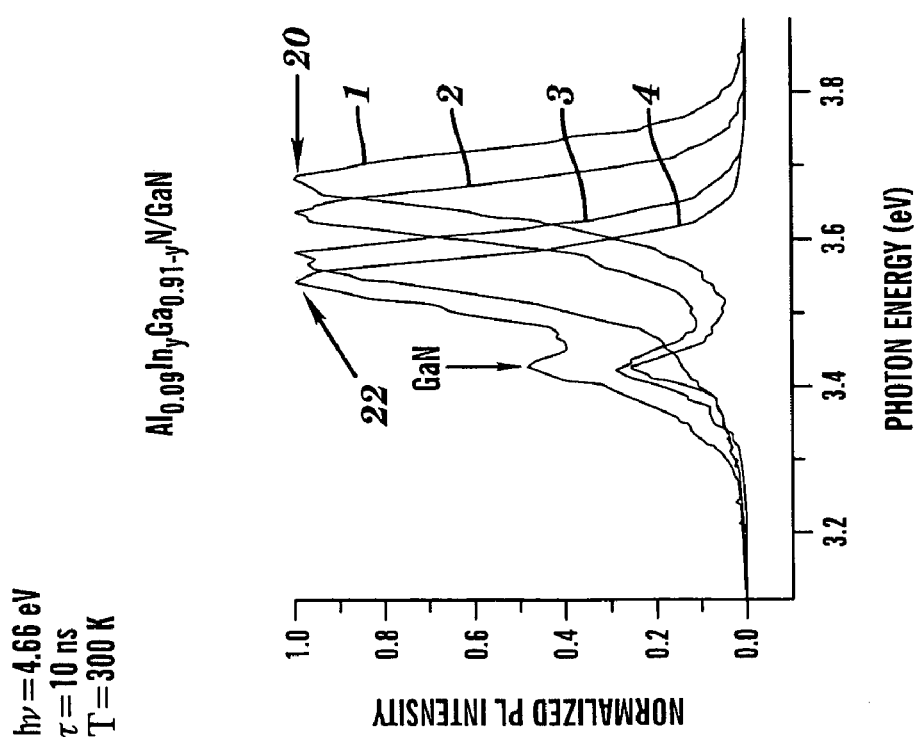
FIG. 3a shows the photoluminescence of AlInGaN grown with different In flows of: 1=0 ccm; 2=25 ccm; 3=50 ccm; 4=75ccm.

FIG. 3a shows the normalized PL intensity of the various compounds as a function of photon energy (eV). Different In flows (0 ccm for curve 1, 25 ccm for 2, 50 ccm for 3 and 75 ccm for 4) are shown. Zero In flow corresponds to $Al_{0.09}Ga_{0.91}N$. The normalized peak PL intensity for the four In flows ranges from about 3.68 eV for zero In flow 20, to about 3.54 eV for an In flow of 75 ccm 22.

FIG. 3b shows the change in lattice constant (triangles, Angstroms) and band gap (circles, eV) as a function of In flow (ccm). Zero In flow corresponds to $Al_{0.09}Ga_{0.91}N$. "Zero" change corresponds to GaN parameters.

The data clearly indicates that the addition of indium changes the lattice constant difference (between GaN and the quaternary) about 3-4 times faster than the bandgap difference. For example, comparing the data for In flow of 75 (in arbitrary units) and the zero In flow, the lattice constant mismatch Dc varies from 0.036 Angstroms 24 to 0.005 Angstroms 26, more than 7 times, whereas the energy gap discontinuity varies only from 0.25 eV 28 to 0.12 eV 29, only a factor of 2. However, for the nearly lattice matched $Al_{0.09}In_{0.02}Ga_{0.89}N$—GaN junction (which corresponds to the In flow of 75), the PL measurements yielded the bandgap difference of only 120 meV, significantly smaller from what was expected using the linear interpolation of the band offsets for a fixed molar fraction of aluminum.

Several $Al_xIn_yGa_{1-x-y}$GaN junctions with barrier thickness less than 50 run and varying alloy compositions (x from 0.1 to 0.2 and y from 0.02 to 0.04) were also grown. For these heterojunctions, room temperature sheet-carrier density and mobility values ranging from $1$-$3 \times 10^{13}$ $cm^{-2}$ and 1000-1500 $cm^2V^{-1}$sec-1 were measured. The mobility values increase by about a factor of 5 upon cooling to 77 K. This establishes the presence of the two-dimensional electron gas at the $Al_xIn_yGa_{1-x-y}N$—GaN heterojunction interface and confirms a high quality of heterointerfaces. $Al_xIn_yGa_{1-x-y}N$—GaN HEMTs were also fabricated with state-of-the-art performance. The fabrication technology for these devices is substantially different from that for conventional AlGaN/GaN HEMTs.

Strong piezoelectric and pyroelectric effects in AlGaN/GaN heterostructures emerged as powerful tools for the development of a novel semiconductor doping technique. In contrast to the conventional impurity doping, this new method does not introduce any new energy levels, carrier traps and scattering centers, which strongly affect electrical characteristics of materials and electronic devices.

Theoretical calculations predicted the comparable contributions of spontaneous polarization and piezoelectric effects to two-dimensional electron density in AlGaN/GaN heterostructures. However, so far, there is no direct experimental evidence for these estimates. It is also important to note that the internal electric fields in pyroelectric materials are usually much smaller than predicted by the theory, which does not account for surface and interface states. In the limiting case, when the surface state density equals or even exceeds $P_s/q$, where $P_s$ is spontaneous polarization and 'q' is the electron charge, the charges trapped in surface and/or interface states can cancel the effect of spontaneous polarization, making an internal electric field vanish inside the film. This is often the case in typical ferroelectric materials, which makes a direct determination of the value of spontaneous polarization and its contribution to two-dimensional electron gas near AlGaN/GaN heterointerface very complicated. Therefore, the direct measurements of the contribution of piezoelectric doping and electron mobility in these AlInGaN/GaN heterostructures were focused on by measuring the properties of two-dimensional electron gas in AlInGaN/GaN heterostructures with different indium incorporation. This indium-controlled strain engineering allowed us to measure the piezoelectric doping in these heterostructures.

The epilayer structures were grown by low-pressure MOCVD on conducting 6H—SiC substrates at 1000 C and 76 torr. They consisted of 100 nm thick AlN buffer layer followed by approximately 0.5 mm thick semi-insulating GaN and a nominally undoped quaternary AlInGaN barrier layer. The different indium incorporation in the structures was achieved by keeping constant triethylgallium (TEA) and triethylaluminum (TEG) fluxes while varying the flux of trimethylindium (TMI).

Figure 4A:
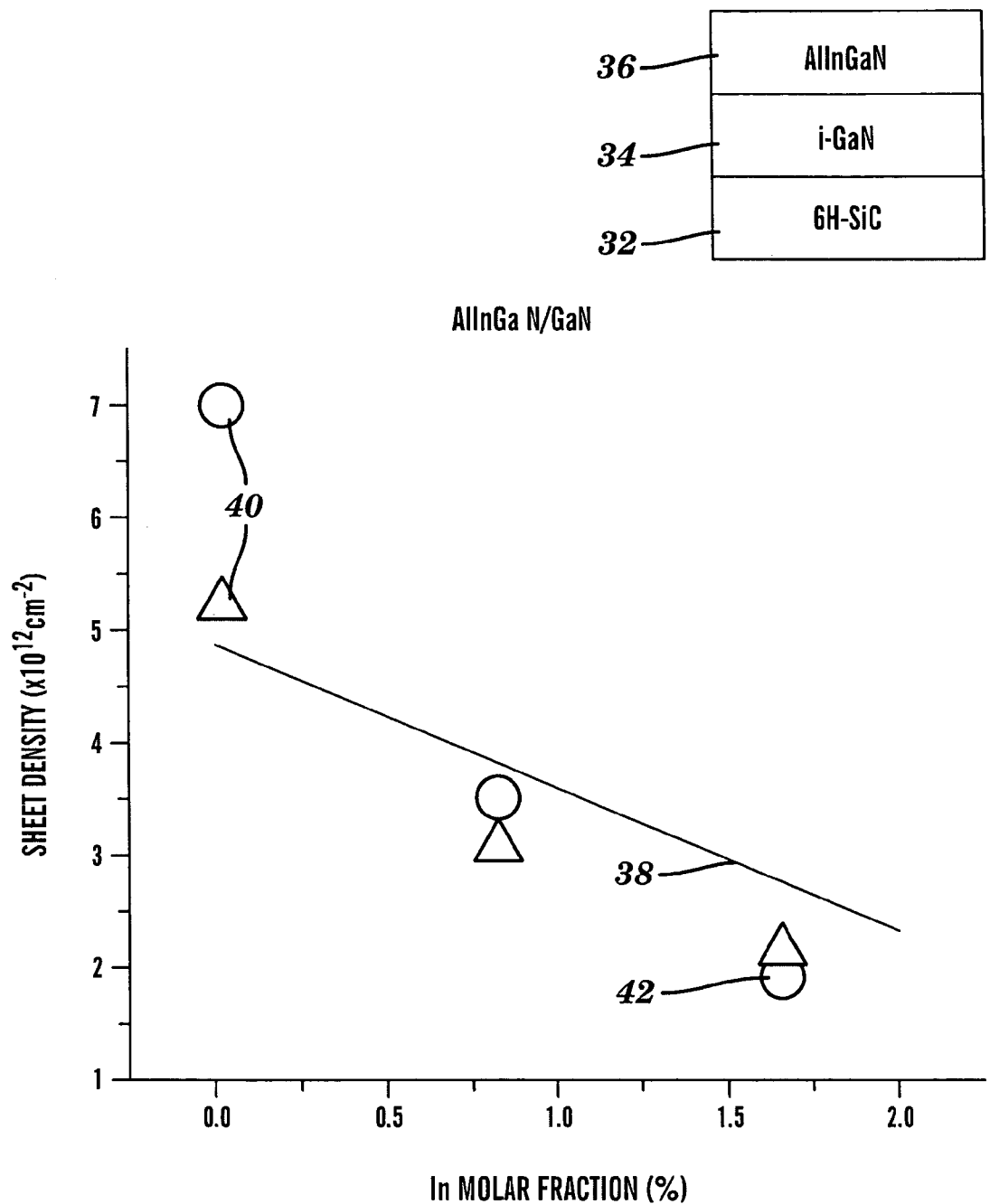

FIG. 4a shows the sheet electron density ($cm^{-2}$) as a function of In molar fraction for heterostructures with a barrier design consisting of a uniform AlInGaN quaternary layer. As shown in the inset, the heterostructure comprises a 6H—SiC (Silicon Carbide) substrate 32, a layer of i-GaN 34 (Gallium Nitride) and a quaternary barrier layer comprising AlInGaN 36 (Aluminum Indium Gallium Nitride). As extracted from Hall measurements, open circles correspond to sheet densities measured at room temperature and triangles correspond to a temperature of 80K. Line 38 represents the expected results from calculations. As determined with SEM pictures, the total thickness of the barrier varied between 15 and 17 nm. The aluminum molar fraction in the barrier was determined from photoluminescence measurements and was approximately 12%.

The lattice matching in the AlInGaN/GaN heterostructures with different indium incorporation were studied by measuring the (θ-2θ) X-ray diffraction peaks arising from the (0006) AlInGaN quaternary barriers and the underlying GaN layers. These data show the AlInGaN-GaN heterostructures to be nearly lattice matched for an estimated indium to aluminum ratio of 5, which is in good agreement with the expectations based upon Vegard's law. The sheet density decreases from approximately $6 \times 10^{12}$ $cm^{-2}$ for a heterostructure with zero indium content 40 (AlGaN/GaN structures) to a sheet density of $2-2.5 \times 10^{12}$ $cm^{-2}$ for the structure with close to 2% of indium 42. Therefore, the lattice matching in AlInGaN-GaN heterostructures with 12% aluminum and 2% indium should in principle nearly eliminate the piezoelectric doping.

Figure 4B:
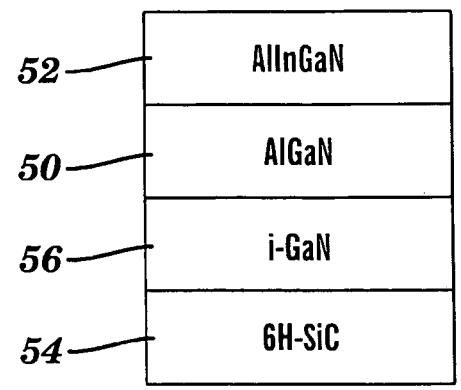
Figure 4B:
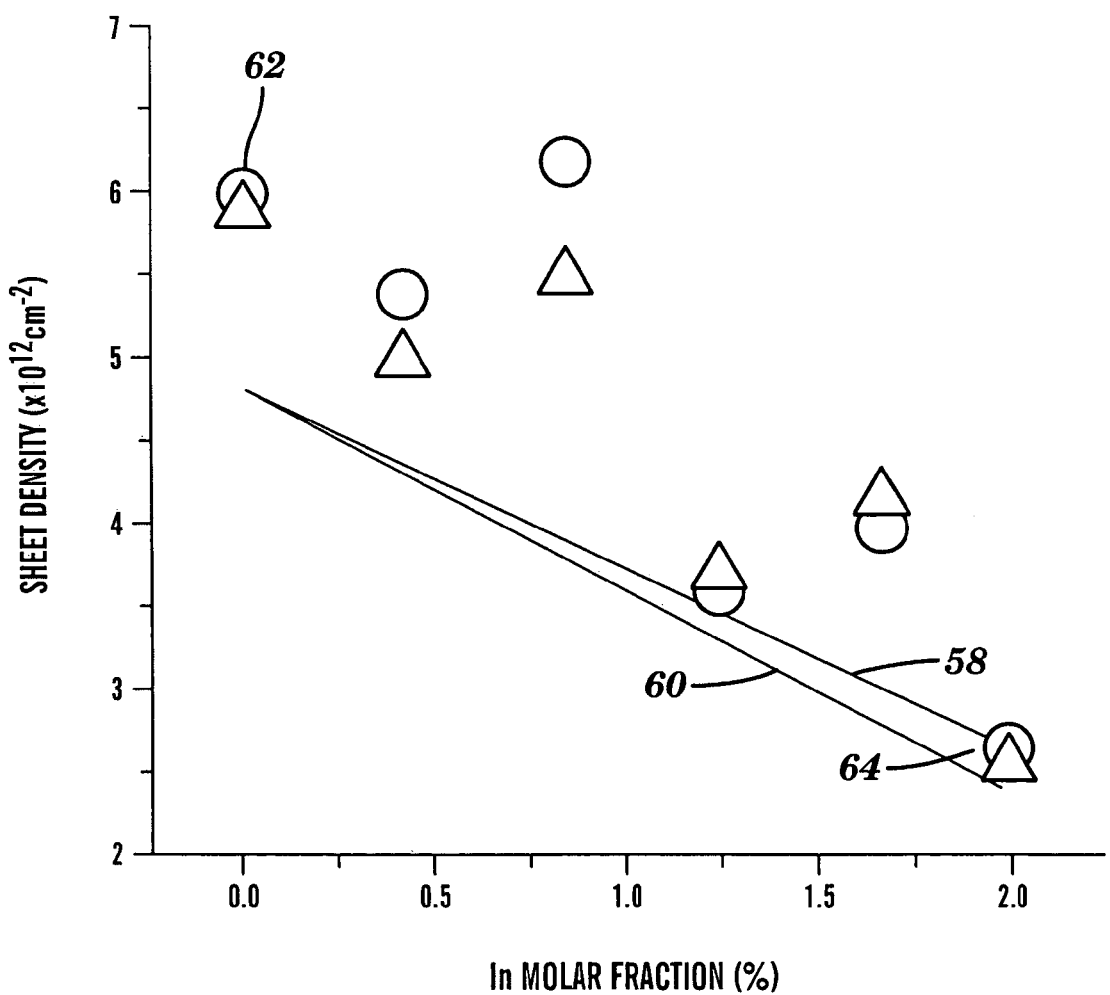

FIG. 4b shows the sheet electron density ($cm^{-2}$) as a function of In molar fraction for heterostructures with an alternative barrier design consisting of a two-layer combination having a 2-3 nm AlGaN (Aluminum Gallium Nitride) ternary layer 50 followed by a 15 nm AlInGaN quaternary layer 52. As shown in the inset, the heterostructure comprises a 6H—SiC substrate 54, a layer of i-GaN 56, a ternary layer of AlGaN 50 and a quaternary layer comprising AlInGaN 52. As extracted from Hall measurements, open circles correspond to sheet densities measured at room temperature and triangles correspond to a temperature of 80 K. Line 58 was calculated for an AlInGaN—AlGaN barrier with 3 nm of AlGaN, while line 60 was calculated for an AlInGaN—AlGaN barrier with 1 nm of AlGaN. As determined with SEM pictures, the total thickness of the barrier varied between 15 and 17 nm. The aluminum molar fraction in the barrier was determined from photo-luminescence measurements and was approximately 12%.

The purpose of incorporating the thin AlGaN ternary layer 50 was to keep the band offset at the heterointerface (barrier/GaN) constant, while controlling piezoelectric doping by incorporating indium into the top portion of the barrier. As shown, the sheet density decreases from approximately $6 \times 10^{12}$ $cm^{-2}$ for a heterostructure with zero indium content 62 (AlGaN/GaN structure) to a sheet density of $2-2.5 \times 10^{12}$ $cm^{-2}$ for the heterostructure with about 2% indium 64.

It should be recognized that other ternary compounds including InGaN are suitable for use as the ternary layer.

Additionally, while SiC is used as the substrate throughout the examples, it should be recognized that the current invention applies equally to the use of other substrates including sapphire, SiC, ZnO, a spinel substrate, Si, anodized alumina, and AlN.

FIGS. 4a and 4b show that the dependence of sheet density on indium molar fraction is nearly the same for the heterostructures with and without the 2-3 nm thick AlGaN ternary layer in the barrier region. This result points to a very small change in the conduction band offset caused by the incorporation of up to 2% of indium, which is in good agreement with theoretical predictions from Vegard's law. Therefore, the decrease in sheet density is attributed primarily to the reduction of the lattice mismatch and the associated strain between the AlInGaN quaternary barrier and the GaN channel layer. From the measurements of sheet density, it is estimated that the contribution of piezoelectric doping in the structures is approximately $4 \times 10^{12}$ $cm^2$.

In order to evaluate the contributions of both piezoelectric and pyroelectric (spontaneous polarization) doping, the experimental data was compared with the calculated values of sheet density as shown by line 38 in FIG. 4a and lines 58, 60 in FIG. 4b. The calculations for $Al_{0.12}In_yGa_{1-0.12-y}N/GaN$ as shown in FIG. 4a, and $Al_{0.12}In_yGa_{1-0.12-y}N/Al_{0.12}GaN/GaN$ as shown in FIG. 4b, accounted for both pyroelectric and piezoelectric effects. The parameters used in the calculations are listed in Table 1 below.

TABLE 1

AlInGaN/GaN parameters used in the calculations

| PARAMETER | UNITS | VALUE |
|---|---|---|
| Total Barrier thickness (L) | nm | 25 (21) |
| Thickness of AlGaN (L1) | nm | 5 (1) |
| Thickness of InAlGaN (L2) | nm | 20 |
| Donor concentration in GaN | $cm^{-3}$ | $10^{15}$ |
| Donor concentration in AlGaN | $cm^{-3}$ | $3 \times 10^{17}$ |
| Al concentration | % | 12 |
| Lattice constant | nm | .3548y + .3112x + .3189(1 − x − y) |
| Schottky barrier | eV | 1.3x + 0.84 |
| $e_{33}$ | $C/m^2$ | 0.97y + 1 − y − x + 1.55x |
| $e_{31}$ | $C/m^2$ | −0.36(1 − y − x) − 0.58x − 0.57y |
| $e_{33}$ | GPa | 200y + 389x + 267 * (1 − x − y) |
| $e_{13}$ | GPa | 94y + 99x + 158(1 − x − y) |
| $In_yAl_xGa_{1-y-x}N/GaN$ Conduction band discontinuity | eV | 0.75 ΔEg |
| $In_yAl_xGa_{1-y-x}N$ band gap | eV | 1.9y + 3.4 * (1 − y − x) + 6.2x |
| $In_yAl_xGa_{1-y-x}N$ spontaneous polarization at zero strain | $C/m^2$ | −0.052 * x − 0.029 |
| Dielectric constant of AlN |  | 8.5 |

The calculated values of sheet density, including only the piezoelectric effects and the spontaneous polarization, are close to the measured values. This indicates that the piezoelectric and pyroelectric effects are the only major contributors to two-dimensional electron-gas. This is expected since the background sheet carrier density due to unintentional doping of the quaternary barrier (AlInGaN) and the channel semi-insulating GaN layer was measured to be not more than $1 \times 10^{12}$ $cm^{-2}$. These measurements were made on thick individual layers. Also, the calculated sheet electron density falls from approximately $5 \times 10^{12}$ $cm^{-2}$ for AlGaN/GaN heterostructures (0% In) to $2.7 \times 10^{12}$ $cm^{-2}$ for (AlInGaN—AlGaN)/GaN and $2.4 \times 10^{12}$ $cm^{-2}$ for AlInGaN/GaN heterostructures with up to 2% of indium. Thus, the calculated contribution of the piezoelectric effects (piezoelectric doping) is approximately $2.5 \times 10^{12}$ cm$^{-2}$, which is about 30% less than measured experimentally. As can be seen from FIGS. 4a and 4b, the data confirms a considerable contribution from the spontaneous polarization.

Figure 5A:
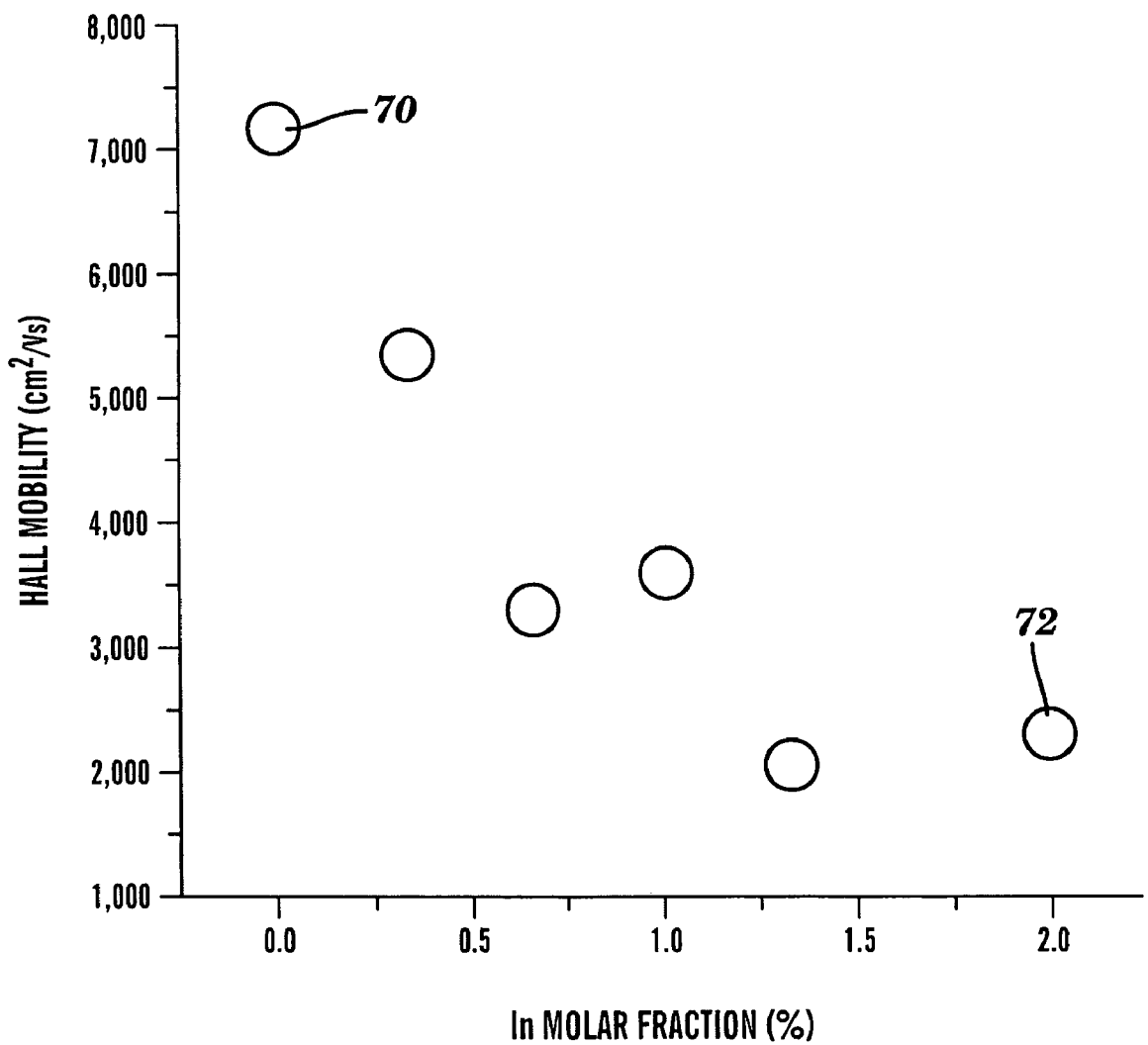
FIG. 5a shows the electron Hall mobility in AlInGaN/GaN heterostructures with 12% Al and different molar fractions of In measured at a temperature of 80 K.

The reduction of strain in AlInGaN/GaN heterostructures with the incorporation of indium not only decreases piezoelectric doping, but also strongly reduces two-dimensional electron mobility. The measured electron Hall mobility, $\mu_H$, in (AlInGaN—AlGaN)/GaN heterostructures at 80 K is shown in FIG. 5a. The incorporation of 2% indium reduces the mobility by more than three times from 7,300 cm$^2$/Vs for zero In content 70 to approximately 2,000 cm$^2$/Vs for 2% In 72. Nearly the same reduction in 80 K Hall mobility was also measured for AlInGaN/GaN heterostructures. At 300 K, the mobility in (AlInGaN—AlGaN)/GaN heterostructures decreased by half from 1,200 cm$^2$ Ns for 0% indium to 600 cm$^2$/Vs for 2% indium. This reduction of Hall mobility in AlInGaN/GaN heterostructures is attributed to the suppression of piezoelectric effects and the associated piezoelectric doping.

Figure 5B:
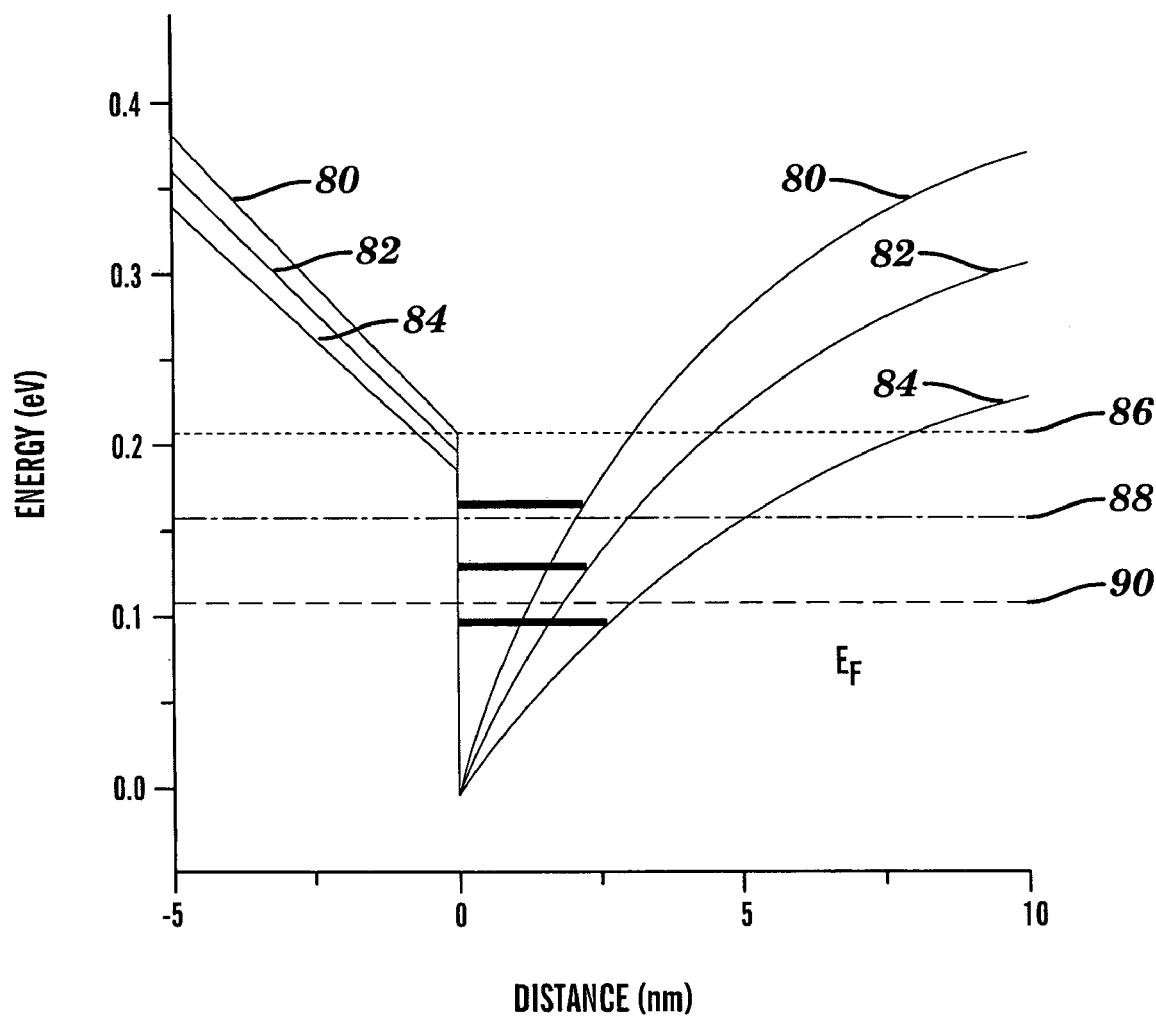
FIG. 5b shows the calculated conduction band diagrams for AlInGaN/GaN heterostructures with 12% Al and different In content.

FIG. 5b shows the calculated band diagrams of AlInGaN/GaN heterostructures with different Indium content. The energy (eV) for each band is shown as a function of distance (nm). Curve 80 corresponds to 0% In incorporation, curve 82 corresponds to 1% In, and curve 84 corresponds to 2% In. Dotted line 86, dotted-dashed line 88 and dashed line 90 mark the Fermi level positions for curves 80, 82 and 84, respectively. Thick solid lines show ground energy levels inside the triangle quantum wells. As seen, the ground state energy and Fermi level in the triangular quantum wells near AlInGaN/GaN heterointerface have higher indium content in the regions of lower electric field (proportional to the band bending) and, thus, have lower quantization. As a result, electrons are becoming less two-dimensional and more bulk-like with lower mobility. Note that the measured decrease in Hall mobility with decease in sheet electron density from the loss of piezoelectric doping in the nearly lattice matched AlInGaN/GaN heterostructures is in good agreement with $\mu_H$ (sheet density) data obtained in AlGaN/GaN heterostructures.

Figure 5C:
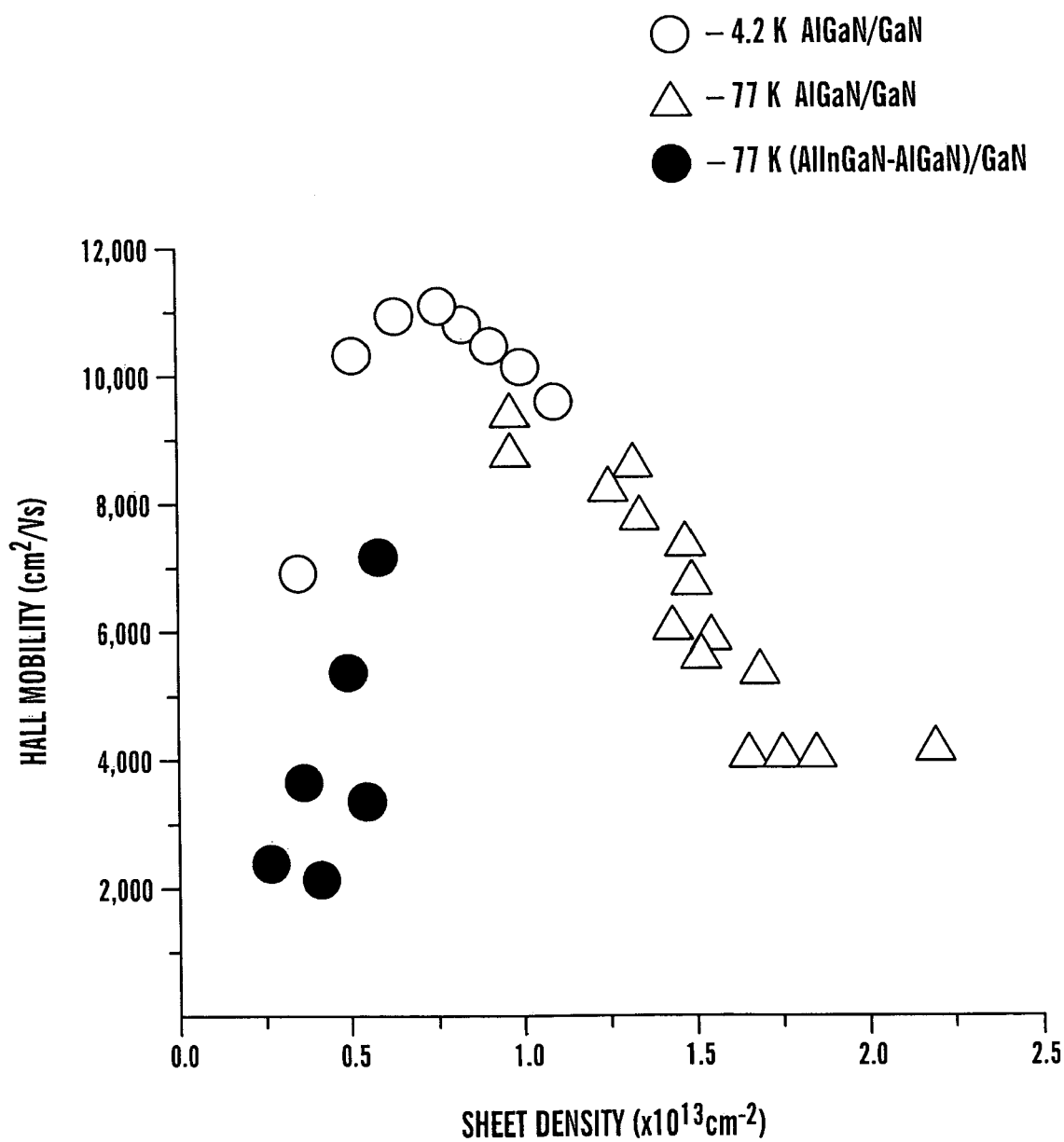
FIG. 5c shows the Hall mobility versus sheet density in (AlInGaN—AlGaN)/GaN at 77 K (solid dots), gated AlGaN/GaN heterostructures at 4.2 K (open circles), and AlGaN/GaN heterostructures with different doping at 77 K (triangles).

FIG. 5c shows two-dimensional Hall mobility (at 80 K) as a function of sheet electron density in the (AlInGaN—AlGaN)/GaN heterostructures with that for AlGaN/GaN heterostructures. The results clearly show the important role of the piezoelectric effects in both doping and the transport properties of two-dimensional electron gas in AlInGaN-GaN heterojunctions.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A nitride based heterostructure device comprising:
   a substrate;
   a buffer layer directly on the substrate, wherein the buffer layer includes In;
   a first layer including GaN directly on the buffer layer;
   a second layer directly on the first layer, wherein the second layer includes AlGaN; and
   a quaternary layer directly on the second layer, wherein the quaternary layer includes AlInGaN.

2. The device of claim 1, wherein the substrate includes one of the group comprising sapphire, SiC, ZnO, a spinel substrate, Si, anodized alumina, and AlN.

3. The device of claim 1, wherein the quaternary layer includes about a 20% to about 30% molar fraction of Al.

4. The device of claim 3, wherein the quaternary layer further includes about a 2% to about 5% molar fraction of In.

5. The device of claim 1, wherein the first layer further includes In.

6. A nitride based heterostructure device comprising:
   a substrate;
   a buffer layer directly on the substrate, wherein the buffer layer includes In;
   a ternary layer directly on the buffer layer, wherein the ternary layer includes Ga, In, and N; and
   a quaternary layer directly on the ternary layer, wherein the quaternary layer includes Ga, Al, In, and N.

7. The device of claim 6, wherein the buffer layer includes Al and N.

8. A nitride based heterostructure device comprising:
   a substrate;
   a buffer layer on the substrate, wherein the buffer layer includes In;
   a first layer including GaN on the buffer layer;
   a second layer on the first layer, wherein the second layer includes AlGaN; and
   a quaternary layer on the second layer, wherein the quaternary layer includes AlInGaN, wherein the quaternary layer includes about a 20% to about 30% molar fraction of Al.

9. The device of claim 8, wherein the quaternary layer further includes about a 2% to about 5% molar fraction of In.

* * * * *